United States Patent
Li

(10) Patent No.: US 7,327,290 B1
(45) Date of Patent: Feb. 5, 2008

(54) IMAGE-DECODING SYSTEM WITH MULTI-RUN MECHANISM AND METHOD THEREOF

(75) Inventor: Shao-lun Li, Kao-Hsiung (TW)

(73) Assignee: MEDIATEK, Inc., Hsin-Chu (TW)

( * ) Notice: Subject to any disclaimer, the term of this patent is extended or adjusted under 35 U.S.C. 154(b) by 0 days.

(21) Appl. No.: 11/421,549

(22) Filed: Jun. 1, 2006

Related U.S. Application Data

(63) Continuation-in-part of application No. 11/207,131, filed on Aug. 17, 2005, now Pat. No. 7,298,297.

(60) Provisional application No. 60/522,116, filed on Aug. 18, 2004, provisional application No. 60/522,128, filed on Aug. 18, 2004.

(51) Int. Cl.
*H03M 7/40* (2006.01)
(52) U.S. Cl. .................. 341/65; 341/50; 341/51; 382/239
(58) Field of Classification Search .......... 341/65, 341/50, 51; 382/233, 236, 239, 245
See application file for complete search history.

(56) References Cited

U.S. PATENT DOCUMENTS

2002/0061141 A1* 5/2002 Kobayashi .......... 382/233
2004/0042675 A1* 3/2004 Kobayashi .......... 382/245
2004/0234144 A1* 11/2004 Sugimoto et al. ........ 382/239
2004/0240745 A1* 12/2004 Sugimoto et al. ........ 382/236

* cited by examiner

*Primary Examiner*—Jean Bruner Jeanglaude

(57) ABSTRACT

An image-decoding system with multi-run mechanism and method thereof are described. The image-decoding system with multi-run mechanism comprises IDLE, COEFF_READ, HUFF_ADDR_LOG, HUFF_ADDR_PHY, EOB_RUN_GEN, AMP_CAL, COEFF_WRITE state units. The IDLE state unit is used to reset a plurality of indicating signals to initial statuses, respectively. The COEFF_READ state unit coupled to the IDLE state unit can reads the data coefficients stored in a memory unit according to the indicating signals. The HUFF_ADDR_LOG state unit coupled to the COEFF_READ state unit locates a logical address of the data coefficients which is referred to the Huffman code to read the content of the data coefficients. The HUFF_ADDR_PHY state unit coupled to the HUFF_ADDR_LOG state unit can reads the data coefficients which are referred to the Huffman code stored in the memory unit to indicate a physical address of the data coefficients. The EOB_RUN_GEN state unit coupled to the HUFF_ADDR_PHY state unit is used to determine at least one run length of the data stream to generate at least one run length value. The AMP_CAL state unit coupled to the EOB_RUN_GEN state unit calculates the amplitude of the data coefficients. The COEFF_WRITE state unit coupled to the AMP_CAL and COEFF_READ state units can write the refined coefficients into the memory unit.

22 Claims, 12 Drawing Sheets

IMAGE-DECODING SYSTEM WITH MULTI-RUN MECHANISM AND METHOD THEREOF

CROSS REFERENCE TO RELATED APPLICATION

This patent application is a Continuation-in-Part and claims priority of U.S. application Ser. No. 11/207,131, entitled "HARDWARE-IMPLEMENTED HUFFMAN DECODER", which is filed on Aug. 17, 2005, incorporated herein by reference and claims priority from both U.S. Provisional Patent Application Ser. No. 60/522,116 and U.S. Provisional Patent Application Ser. No. 60/522,128, which are filed on Aug. 18, 2004 and incorporated herein by reference.

FIELD OF THE INVENTION

The present invention relates to an image-decoding system and method, and more particularly to an image-decoding system with multi-run mechanism and method thereof.

BACKGROUND OF THE INVENTION

Currently, more than ninety percent of the still image formats on the communication network are JPEG (Joint Photographic Experts Group) format. Most of the multimedia electronic products utilize JPEG as default format to transfer image files on-line.

A JPEG file can be divided into a plurality of frames for encoding and decoding procedures. Two DCT-based (Discrete Cosine Transform) compression modes, baseline and progressive, of JPEG files are currently available. In the baseline mode, the JPEG frame is scanned at a time to generate image information. In the progressive mode, the JPEG frame is repeatedly scanned at several scans to form the image information.

There is a need to create progressive image decoder which is fully accelerated by hardware to decode image file. Since the progressive mode comes along with much higher complexity, it raises a problem of low decoding speed in the conventional image decoder. It is an important issue to have a better JPEG decoder for rapidly decoding JPEG images in either baseline or progressive modes.

Conventionally, a JPEG image file in progressive mode is scanned by DC first scan, DC refine scan, AC first scan, or AC refine scan. When an image file is scanned in DC scan, the scan contains only DCT coefficient 0. If an image frame is scanned in AC scan, the scan contains no DCT coefficient 0. Additionally, a first scan means that a scan contains MSBs (most significant bits) of DCT coefficients and a refine scan means that a scan contains no MSBs of DCT coefficients. For progressive JPEG images, DC coefficients can be completely retrieved according to each DC first scan and DC refine scan. Similarly, AC coefficients can be fully retrieved according to each AC first scan and AC refine scan.

Particularly, due to the nature of progressive JPEG compression, a memory unit serves as a temporary buffer for storing the whole JPEG image, which is necessary for decoding a progressive JPEG image. Generally, the memory unit is used to store the intermediate, partially decoded coefficients. All coefficients must remain in the memory unit until all scan procedures are processed.

The size of memory unit is determined by the decoding image size. If the image size is W×H, the size of the memory unit will be $W \times H \times N_1 \times N_2$, where $N_1$ represents the number of the components in the decoding image and $N_2$ represents the number of bits in each coefficient of each component. For example, assuming there are totally 3 components and each coefficient of a component is 11 bits, for a VGA size, the size of the memory unit should be about 1.2 Mbytes (Megabytes) (640×480×3×11). For portable electronic devices, such as cellular phones and PDA, it is undesirable to allocate 1.2 Mbytes memory for progressive JPEG image decoding.

Consequently, there is a need to provide a novel image-decoding system to solve problems of speed performance and memory usage.

SUMMARY OF THE INVENTION

The first objective of the present invention is to provide an apparatus and method of image-decoding with multi-run mechanism to improve the speed performance in image decoder, such as progressive JPEG decoder.

The second objective of the present invention is to provide an apparatus and method of image-decoding with multi-run mechanism to save memory usage when progressive JPEG decoder is employed.

According to the above objectives, the present invention sets forth an image-decoding system with multi-run mechanism for processing a plurality of data coefficients in a data stream composed of a plurality of portions. The image-decoding system with multi-run mechanism comprises a decoding unit, an address generator, and a memory unit.

The decoding unit reads the data coefficients in each portion, respectively. The address generator coupled to the decoding unit figures out a logical address of a codeword corresponding to the data coefficients and figures out a physical address of the codeword corresponding to the data coefficients to allow the decoding unit to locate the codeword corresponding to the data coefficients based on the logical address and the physical address of the codeword. The memory unit coupled to the decoding unit and the address generator stores the codeword and the data coefficients. The decoding unit determines run length of the data coefficients to generate run length information according to the codeword, computes the amplitude of the data coefficients based on the run length information, and writes the computed data coefficients into the memory unit according to the physical address to update the data coefficients in the memory unit during a first scan mode, and the decoding unit further refines the updated data coefficients according to the run length information generated during the first scan mode if the decoding unit changes from the first scan mode to a second scan mode in order to increase the speed performance of the image-decoding system.

The method of processing a plurality of data coefficients in a data stream composed of a plurality of portions, the method comprising the steps of: reading the data coefficients in each portion, respectively, by a decoding unit; figuring out a logical address of a codeword corresponding to the data coefficients; figuring out a physical address of the codeword corresponding to the data coefficients to allow the decoding unit to locate the codeword corresponding to the data coefficients based on the logical address and the physical address of the codeword; determining run length of the data coefficients to generate run length information according to the codeword during a first scan mode; computing the amplitude of the data coefficients based on the run length information during the first scan mode; writing the computed data coefficients into the memory unit according to the physical address to update the data coefficients in the memory unit during the first scan mode; and refining the updated data coefficients in the memory unit according to the run length information generated during the first scan mode if the decoding unit changes from the first scan mode to a second scan mode.

The advantages of the present invention include: (a) improve the speed performance in image decoder; (b) the image-decoding system saves memory of the image-decoding system; and (c) because the AC coefficient amplitude information from previous AC first scan is acquired, an AC refine scan in the present invention can decode the bit stream correctly.

DETAILED DESCRIPTION OF THE PREFERRED EMBODIMENTS

The present invention is directed to an image-decoding system with multi-run mechanism and method thereof to improve the speed performance of image decoder, e.g. progressive JPEG decoder. Further, the image-decoding system saves memory of the image-decoding system to lift the memory usage limit. In one preferred embodiment of the present invention, the format of image file is JPEG based on the progressive JPEG decoder.

Figure 1:
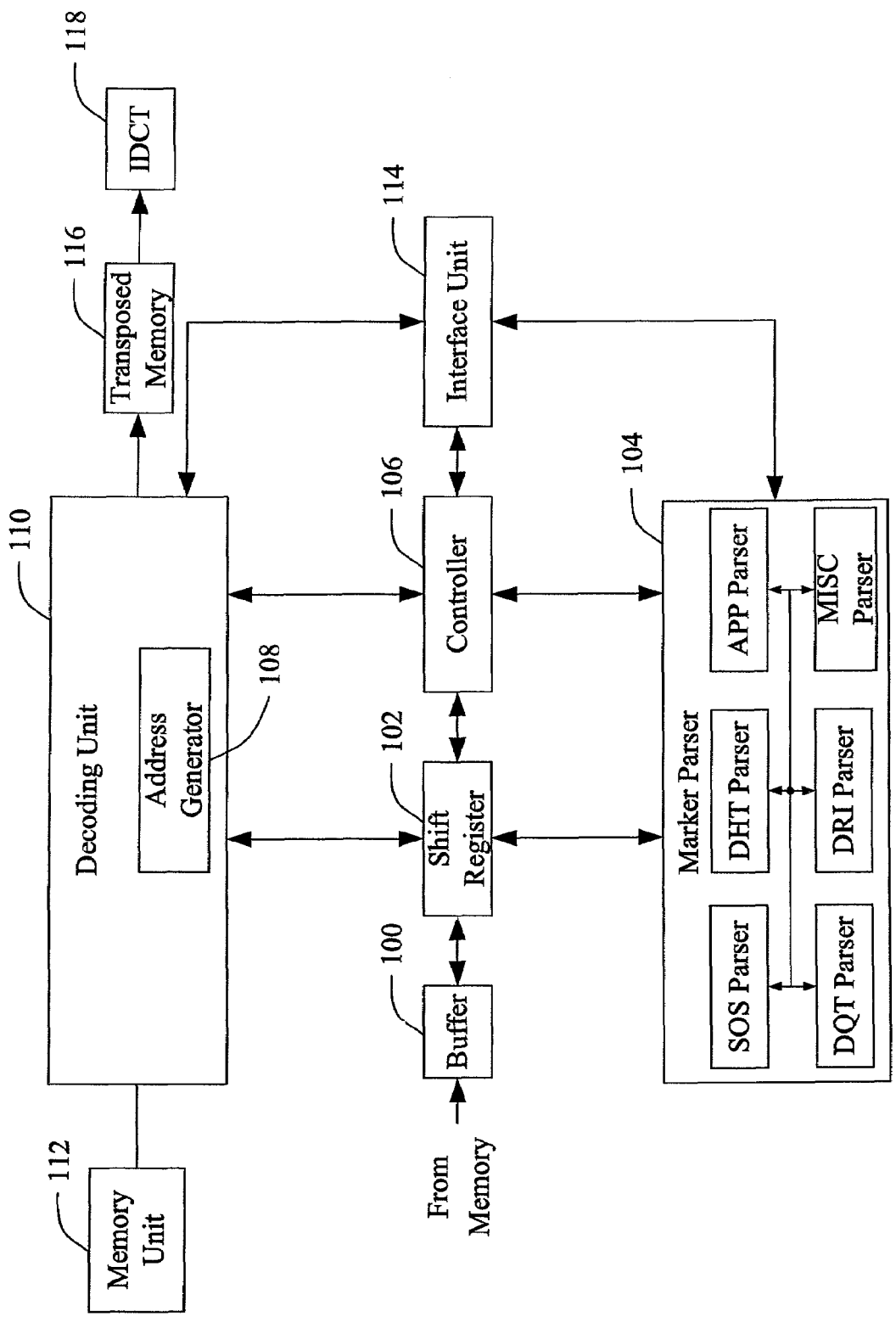
FIG. 1 is a block diagram of an image-decoding system in hardware to decode image file according to one embodiment of the present invention.

FIG. 1 is a block diagram of an image-decoding system in hardware to decode image file according to one embodiment of the present invention. The image-decoding system comprises a buffer 100, a shift register 102, a marker parser 104, a controller 106, an address generator 108, a decoding unit 110, and a memory unit 112. Preferably, the buffer 100 is a direct memory access (DMA) buffer. The decoding unit 110 is suitable for a Huffman decoder to decode JPEG image files. The image-decoding system further comprises an interface unit 114, such as AMBA (advanced microprocessor bus architecture) peripheral bus (APB), to program the control registers located in the marker parser 104, the controller 106, and the decoding unit 110.

The buffer 100 receives an image frame, having a frame header and scan sections, in an image file. The received image frame is then transmitted to the shift register 102. The shift register 102 distributes the frame data to the marker parser 104, the controller 106, and the decoding unit 110. The controller 106 controls handshaking between the marker parser 104 and the decoding unit 110 to deal with communication signals. The marker parser 104 parses the header information from the frame header, scan header and RST section. The decoding unit 110 decodes data bits from data steam of the image file. Since the header information and data bits are followed each other, the controller 106 is able to recognize the header information and data bits correctly.

In some embodiments, the marker parser 104 comprises SOS (Start of Scan) header parser, DHT (Define Huffman Table) header parser, DQT (Define Quantization Table) header parser, and DRI (Define Restart Interval) header parser. These header parsers are used to parse a variety of headers, such as SOS headers, DHT headers, DQT headers, and DRI headers. The marker parser 104 activates at least one header parser to retrieve header information. The marker parser 104 also has an APP parser and miscellaneous (MISC) parsers.

The address generator 108 is used to figure out memory address to store/load progressive coefficients for later scans to update. The decoding unit 110 converts Huffman-encoded data stream into raw data bits to perform inverse discrete cosine transform in IDCT (Inverse Discrete Cosine Transform) unit 118 via transposed memory 116. In one embodiment, the memory unit 112 which stores data for decoding is located in the decoding unit 110.

In one preferred embodiment, Huffman decoding-related tables, such as four quantization tables, four DC Huffman tables, and four AC Huffman tables, can be pre-stored in internal or external hardware devices coupled to the marker parser 104 for image decoding. The Huffman decoding-related tables are generated by Huffman encoder and the decoder decodes data bits by referring to the stored tables.

Figure 2A:
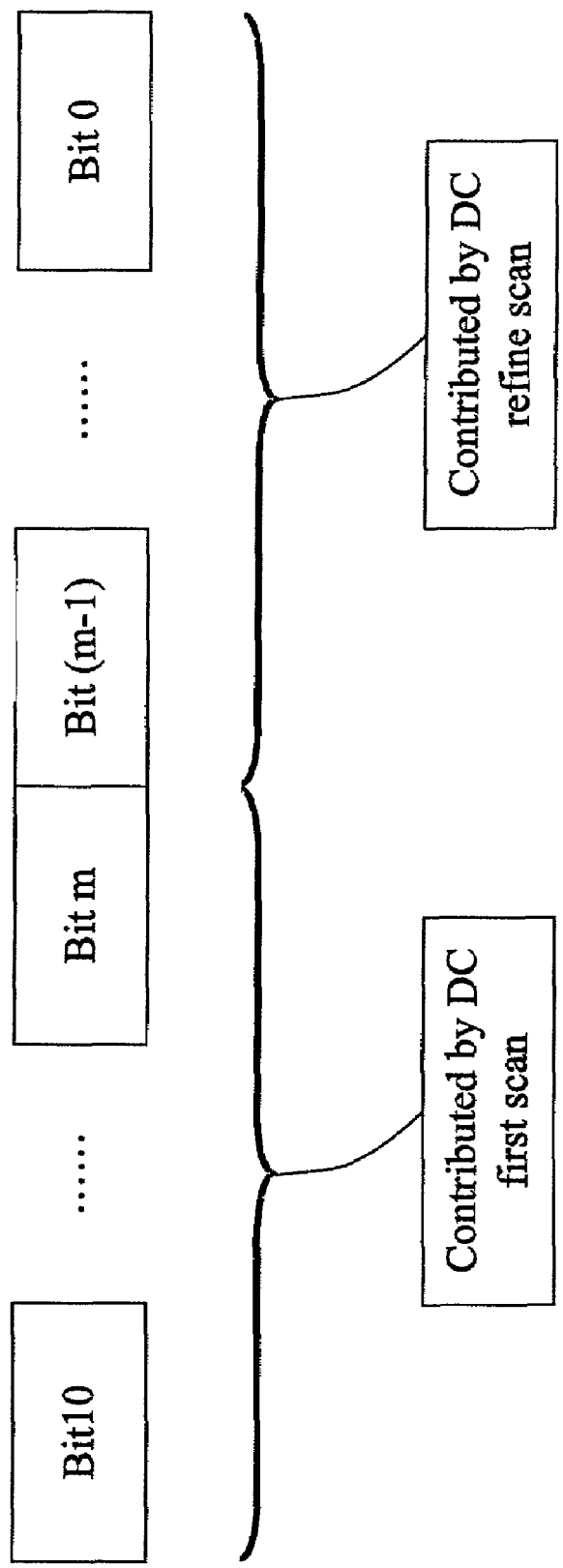
FIGS. 2A and 2B are a relationship diagram between DC/AC coefficients and different scans according to one embodiment of the present invention.
Figure 2B:
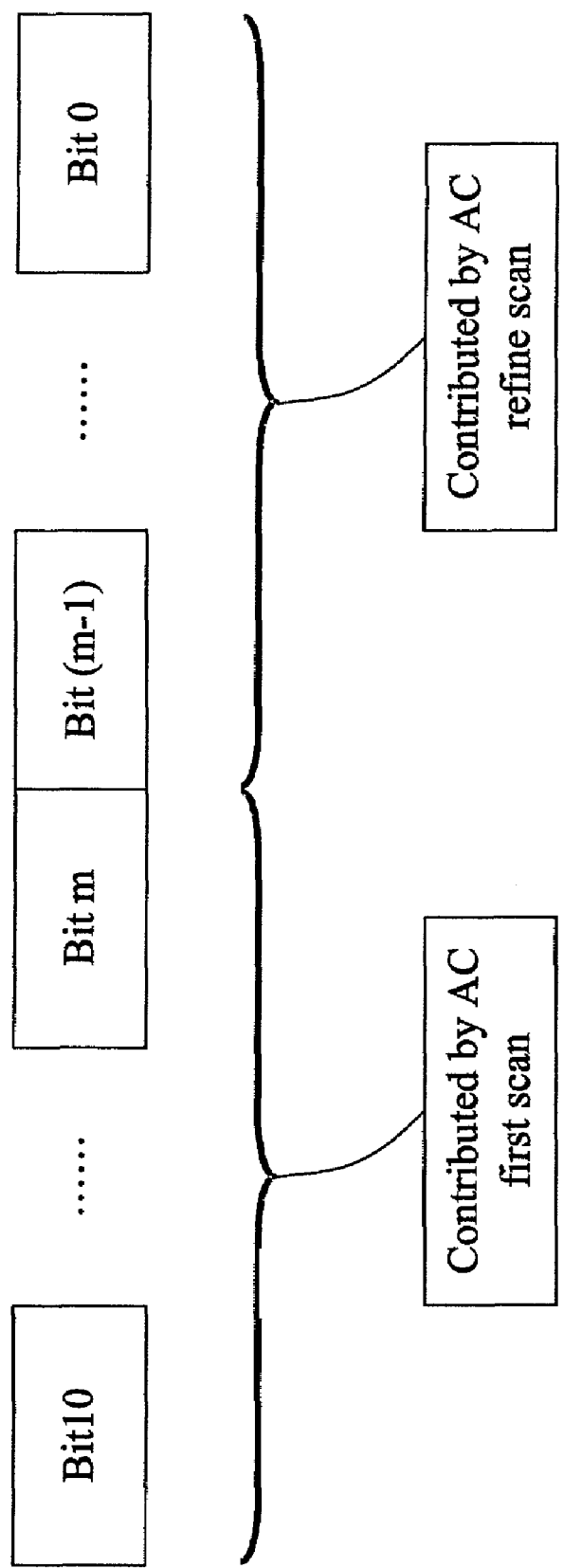

FIGS. 2A and 2B are a relationship diagram between DC/AC coefficients and different scans according to one embodiment of the present invention. In FIG. 2A, if a DC coefficient is 11 bits in length, bit 0 to bit (m−1) is contributed by DC refine scan and bit m to bit 10 is contributed by DC first scan. In FIG. 2B, if an AC coefficient is 11 bits, bit 0 to bit (n−1) is contributed by AC refine scan and bit n to bit 10 is contributed by AC first scan. MSBs and LSBs (least significant bits) of DC/AC coefficients are located in different positions of different scans. The variables m and n can be different for Y, U, and V components of an image frame. A scan, such as a DC first scan, DC refine scan, AC first scan or AC refine scan, includes one, two, or three components. A decoding unit 110 can decode Huffman-encoded data stream in all kinds of scans. If an image frame is scanned in progressive scan mode, each scan includes one to three data components and each component includes a plurality of data units, e.g. the size of 8×8.

For a clear explanation of the present invention, the image-decoding system with multi-run mechanism comprises fourteen states in the decoding unit and theses states are described as following items:

1. IDLE state is an initial status to reset a portion of hardware signals. For example, the coeff_index is reset to the starting index.

2. COEFF_READ state is used to read coefficients from the memory unit to update.

3. HUFF_ADDR_LOG state is used to figure out logical address of the codeword which is referred to the Huffman code to read back the codeword.

4. HUFF_ADDR_PHY state is used to read the codeword which is referred to the Huffman code from the memory unit.

5. EOB_RUN_GEN state is to determine eob_run and zero_run.

6. AMP_CAL state is to calculate the non-zero coefficient amplitude based on "size" and the raw data bits from barrel shift register.

7. COEFF_WRITE state is used to write the refined coefficients into the memory unit.

8. RELOAD_SCAN_START_ADDR state is used to restore the DMA address where the current AC refine scan starts MCU skipping in the previous run.

9. RELOAD_EOB_RUN state is used to regain eob_run and ptr value from memory unit 112.

10. BYPASS_DATA state is that after getting back DMA address, EOB run and ptr value in RELOAD_SCAN_START_ADDR state and RELOAD_EOB_RUN state, hardware will move to BYPASS_DATA state to bypass the data processed already in the previous runs.

11. RELOAD_CTRL state is that after data bypassing is done and before huffman decoder can start normal decoding process on AC refine scan, two control signals need to be brought back from memory.

12. SAVE_SCAN_START_ADDR state is that a copy of the current DMA address is written into memory; this copy of the current address is for the use of the next run of JPEG progressive decoding and will be read back in RELOAD_SCAN_START_ADDR state.

13. SAVE_EOB_RUN state is that a copy of the current eob_run is written into the memory unit; this copy of the current eob_run is for the use of the next run of JPEG progressive decoding and will be read back in RELOAD_EOB_RUN state.

14. SAVE_CTRL state is that a copy of "cnt" and "ri_mcu_cnt" are written into memory; the copy of "cnt" and "ri_mcu_cnt" are for the use of the next run of JPEG progressive decoding and will be read back in RELOAD_CTRL state.

Figure 3A:
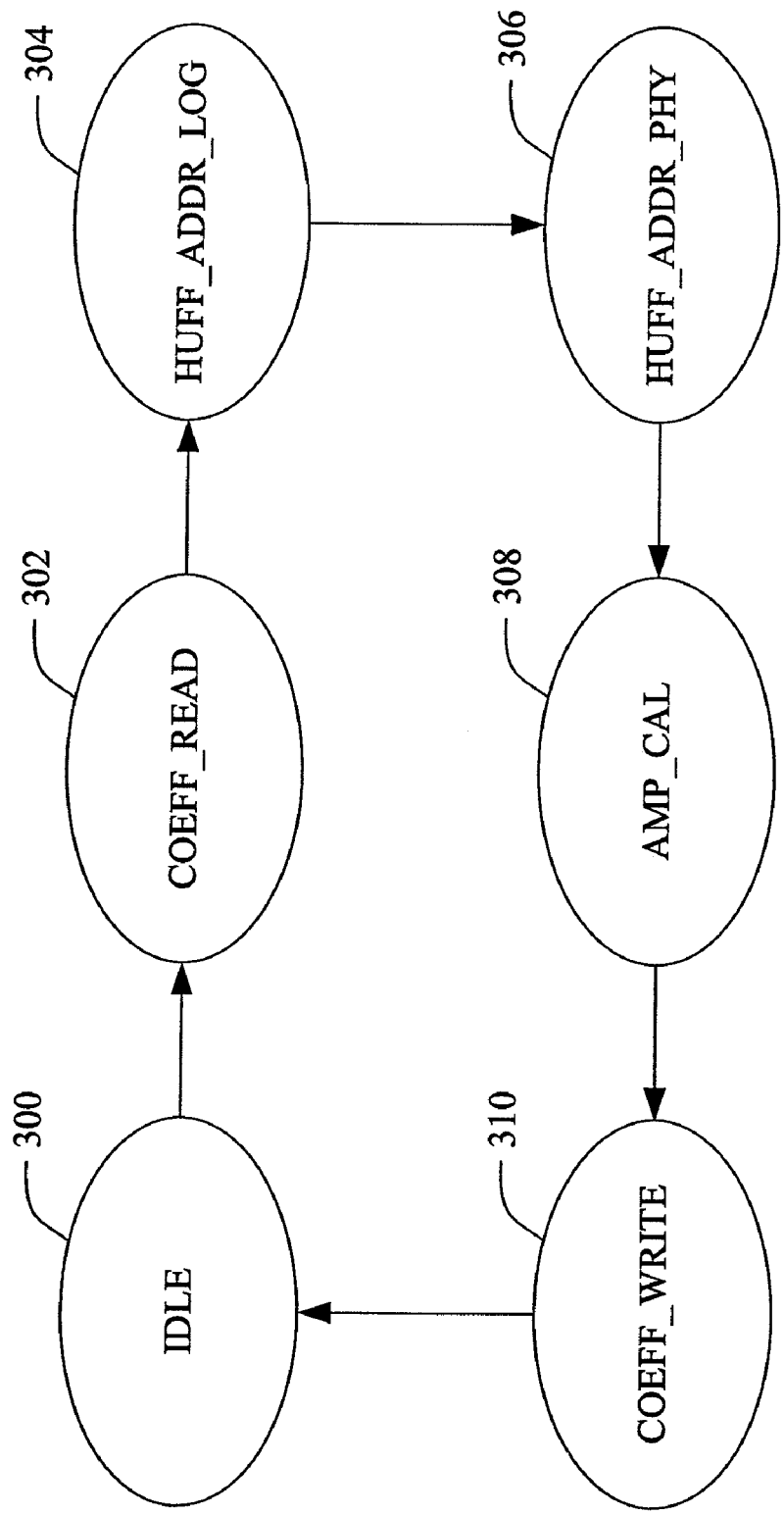
FIG. 3A is a state diagram of DC first scan in the image-decoding system according to one embodiment of the present invention.

FIG. 3A is a state diagram of DC first scan in the image-decoding system according to one embodiment of the present invention. Person skilled in the art should be noted that a DC first scan decoding process is the same as baseline JPEG image decoding except that the DC coefficients must be written back to memory unit for later DC refine scan to update. Although DC first scan doesn't read back previously decoded coefficient to update, the state machine may still need to go to state COEFF_READ 302 from state IDLE 300 because every read/write access in JPEG decoder is, for example, 32 bits, which contains two 11-bit coefficients. If the hardware of image-decoding system changes one coefficient without knowing the value of the other, a write access will corrupt the other coefficient. That's the reason why state COEFF_READ 302 is still required for DC first scan.

Afterwards, the state proceeds to the Huffman decoding states, HUFF_ADDR_LOG 304 and HUFF_ADDR_PHY 306. State HUFF_ADDR_LOG 304 is used to generate the "logical" address of the run/length data bits embedded in the Huffman code. The reason to have a "logical" address is because the marker parser stores the Huffman tables in different memory address at a time. After logical address is generated, a physical address is calculated in state HUFF_ADDR_PHY 306. In the meantime, a memory read is triggered at the calculated physical address. After the run/length is available, the hardware of image-decoding system moves to state AMP_CAL 308 to compute the DC coefficient value. Then, the DC coefficient is stored in memory unit by state COEFF_WRITE 310 at the physical address provided by progressive address generator. A portion of decoded DC coefficient values are needed for the DC refine scan.

Figure 3B:
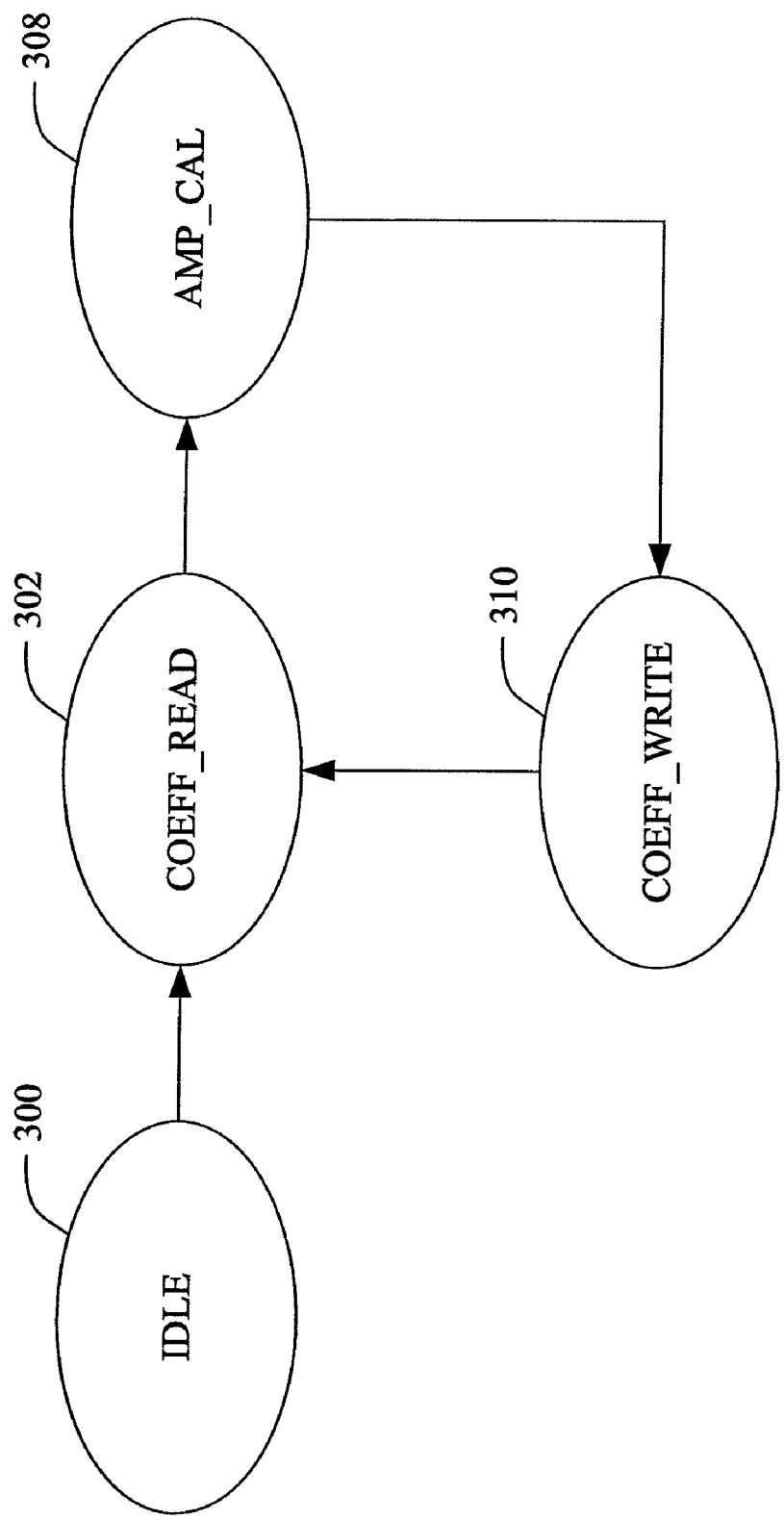
FIG. 3B is a state diagram of DC refine scan in the image-decoding system according to one embodiment of the present invention.

FIG. 3B is a state diagram of DC refine scan in the image-decoding according to one embodiment of the present invention. A DC refine scan is to process raw data bit. Preferably, a DC refine scan updates one bit of the previous decoded DC coefficients at a time. However, the DC refine scan also processes a plurality of bits each time. First, the state proceeds from state IDLE 300 to state COEFF_READ 302 to read back the DC coefficients written by previous DC first scan or DC refine scan. Since the DC refine scan is composed of raw data bits, the hardware proceeds to state AMP_CAL 308 to extract the raw data bit to update the current DC coefficient. After the update step is complete, the DC coefficient is written to the same memory address, where it was read out, by state COEFF_WRITE 310.

Figure 3C:
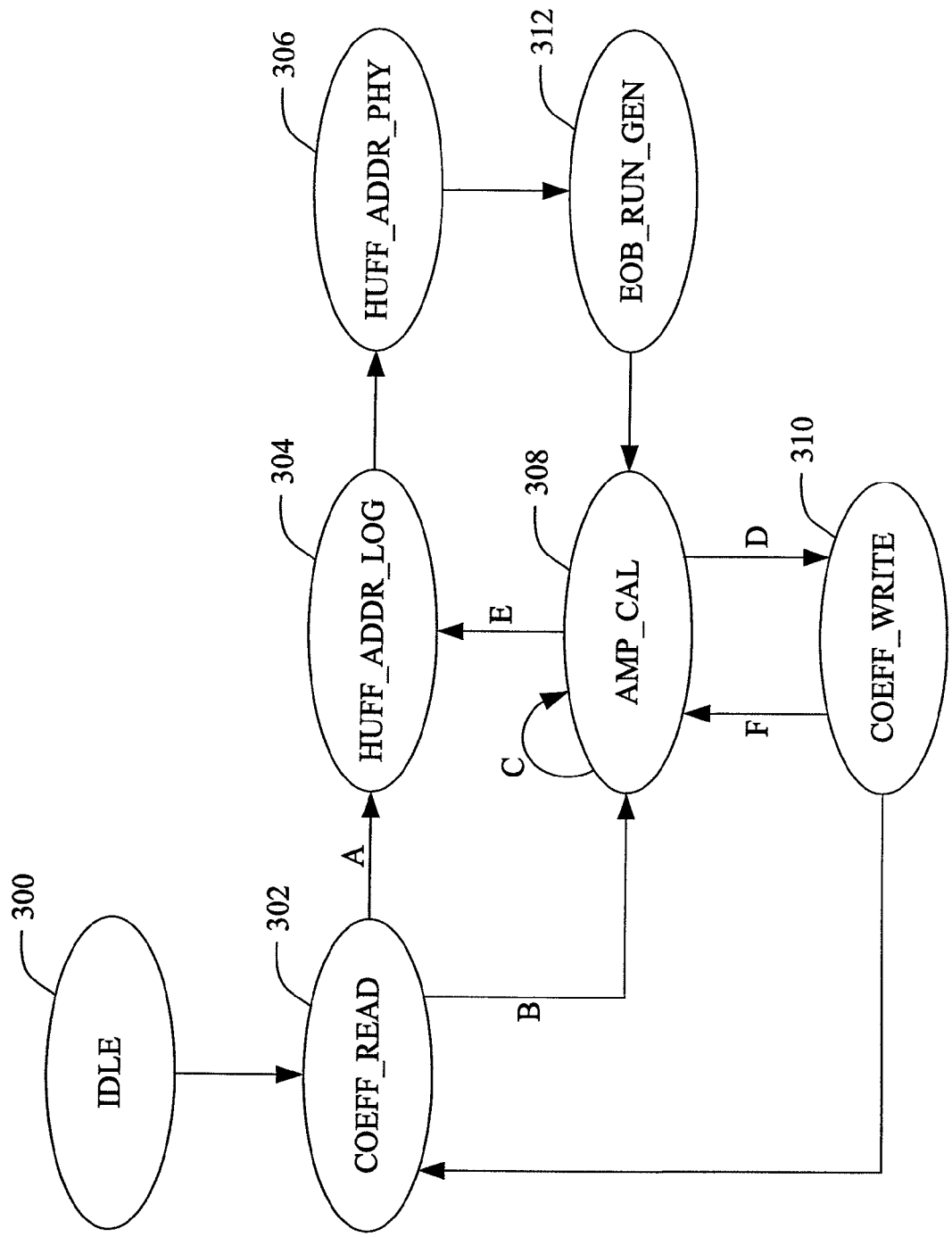
FIG. 3C is a state diagram of AC first scan in the image-decoding system according to one embodiment of the present invention.

FIG. 3C is a state diagram of AC first scan in the image-decoding system according to one embodiment of the present invention. An AC first scan is similar to DC first scan except for zero run and EOB (End of Block) run. Zero run is generated by zero run length coding and represents the number of zeros before the next non-zero coefficient in current block, e.g. the size of 8×8. In other words, zero run is treated as length of zero. Similar to zero run, EOB run is defined as the length of EOB. An EOB in AC first scans means all AC coefficients in the current block are zero. If EOB run is three, it means the next three blocks have no non-zero AC coefficients. Note that a zero AC coefficient in AC first scan doesn't mean it is still zero after later AC refine scans.

An AC first scan state diagram in detail is shown in FIG. 3C. For the same reason as DC first scan in FIG. 3A, state COEFF_READ 302 prior to state IDLE 300 is required in order not to disrupt the content of previously decoded coefficients. After that, the hardware checks zero run and EOB run to determine whether the next state is state HUFF_ADDR_LOG 304 or AMP_CAL 308. When either zero run or EOB run exists, e.g. carrying a positive value, the decoder of AC first scan indicates that the next non-zero AC coefficient is not reached. Hence the next state is state AMP_CAL 308 because the current AC coefficient should be programmed to zero without performing Huffman decoding and the path "B" is taken in FIG. 3C. Otherwise, when both zero run and EOB run are zero, the current AC coefficient is non-zero and Huffman decoding is performed to determine its value. Under this condition, path "A" is taken in FIG. 3C.

When proceeding to path "A", it goes through state HUFF_ADDR_LOG 304 and HUFF_ADDR_PHY 306 to acquire run/length information bits from AC Huffman tables in the memory unit. After run/length information is available, the state EOB_RUN_GEN 312 checks whether the run/length has EOB run information. When the run/length indicates the EOB run is not zero, the hardware stores the EOB run length and set the AC coefficients as zeros in the following blocks. No matter if EOB run is zero or not, the state is moved to state AMP_CAL 308 to program the AC coefficient to generate a zero or non-zero value. Same actions are taken in state AMP_CAL 308 when path "B" is chosen.

In state AMP_CAL 308, there are three next states to be chosen via path "C", "D", and "E". It should be noted that each read/write access to progressive coefficient buffer affects two coefficients. The first coefficient is even-indexed as coefficient 2k and the second one is odd-indexed as coefficient (2k+1). When the hardware is processing coefficient 2k and identifies the zero run or EOB run is non-zero, it stays in state AMP_CAL 308 and chooses path "C". When the hardware is processing coefficient (2k+1) and identifies the zero run or EOB run is non-zero, it moves to state COEFF_WRITE 310 and chooses path "D" to write coefficient 2k and (2k+1) back into memory unit. When the hardware is processing coefficient (2k+1) and both zero run and EOB run are zero, the hardware also moves to state COEFF_WRITE 310 to write coefficient 2k and (2k+1) via path "D". But when the hardware is processing coefficient 2k and both zero run and EOB run are zero, the hardware is moved to state HUFF_ADDR_LOG 304 to get the next run/length information bits to determine the value of coefficient (2k+1) via path "E". In state COEFF_WRITE 304, when the zero run or EOB run is not zero, the state transits back to state AMP_CAL 308 via path "F" since the next AC coefficient is definitely zero.

Figure 3D:
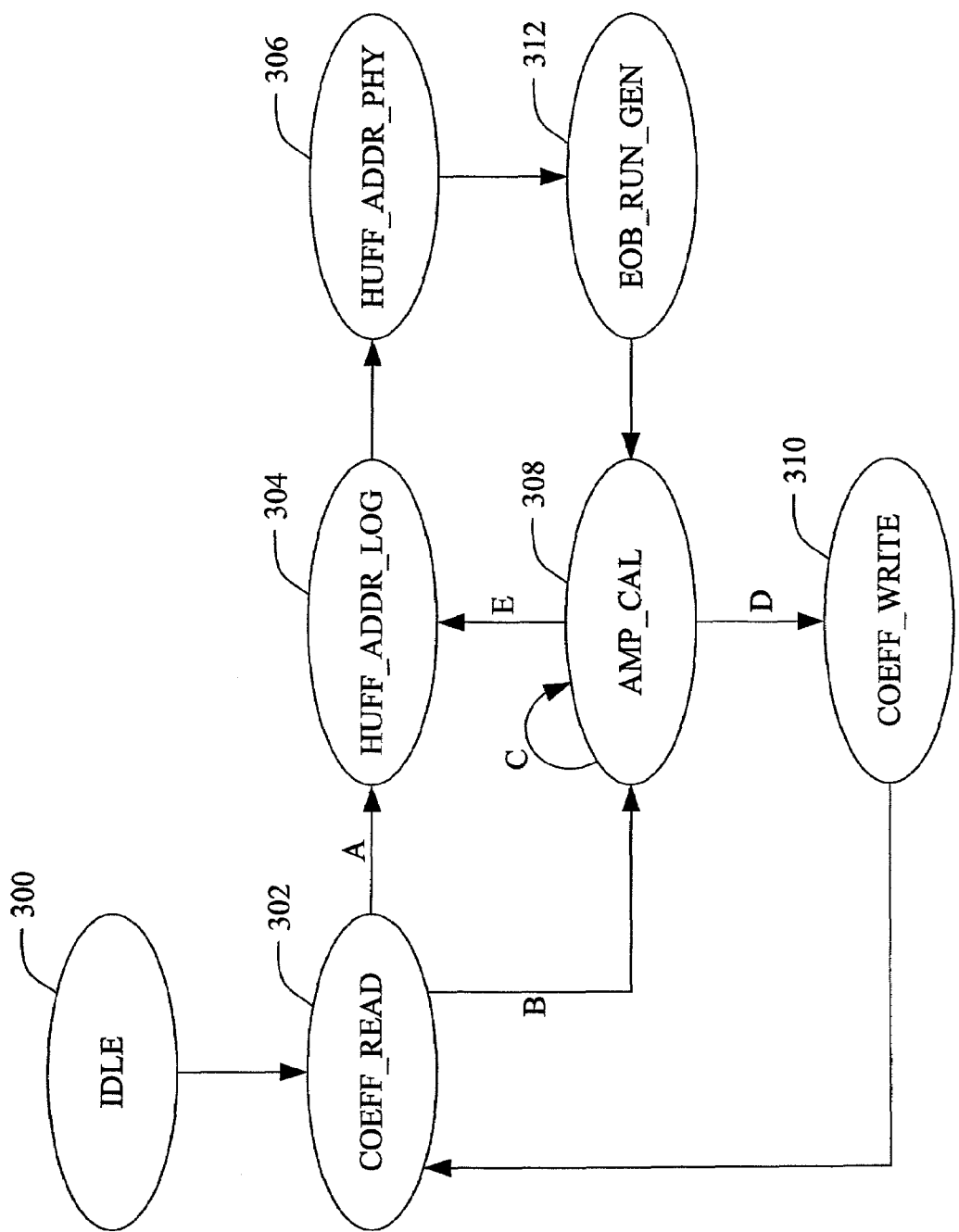
FIG. 3D is a state diagram of an AC refine scan in the image-decoding system according to one embodiment of the present invention.

FIG. 3D is a state diagram of AC refine scan in the image-decoding system according to one embodiment of the present invention. The state diagram in AC refine scan is similar to that in AC first scan. One difference is that there is no path "F" from state COEFF_WRITE 310 to state AMP_CAL 308 because AC refine scan needs to check every AC coefficients even when the zero run or EOB run is not zero. The reason is that AC refine scan refines AC coefficients programmed with non-zero value by previous AC first scans or AC refine scans no matter what the value of zero run or EOB run is.

Figure 4:
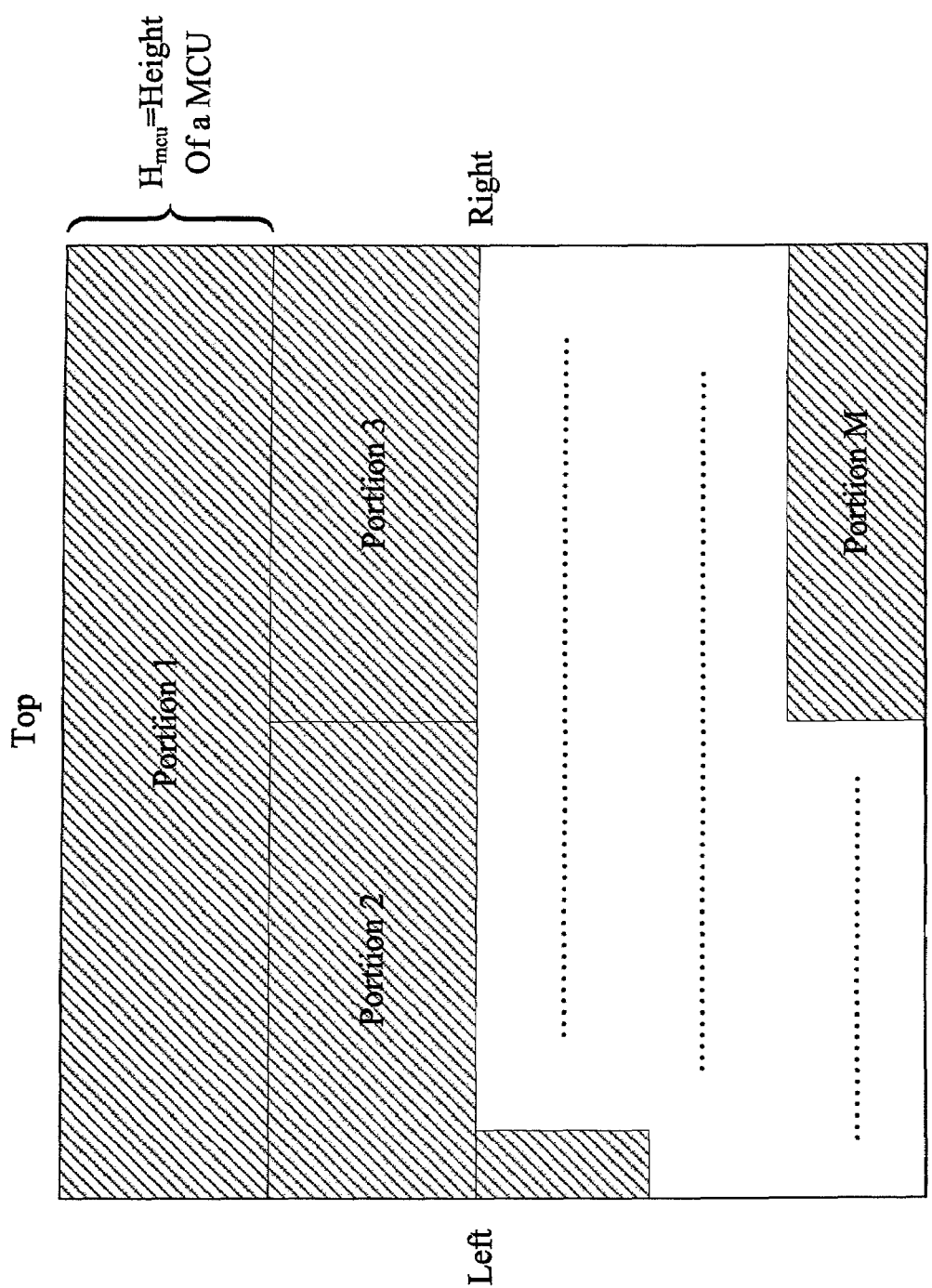
FIG. 4 is a diagram of an image file divided into a plurality of consecutive portions by the multi-run mechanism according to one embodiment of the present invention.

FIG. 4 is a diagram of an image file divided into a plurality of consecutive portions by the multi-run mechanism according to one embodiment of the present invention. In the multi-run mechanism, an image is divided into a plurality of consecutive portions, e.g. portion 1 to M. For each run, only one portion is processed by decoding unit 110 and shown on a display unit, e.g. LCD. Advantageously, since only one portion is processed, the temporary buffer just has to retain the coefficients of the portion and the size of the memory unit is greatly reduced. Preferably, the smallest portion size is one minimum coded unit (MCU). In JPEG specifications, the maximum MCU is composed of ten 8×8 data units and each coefficient takes 2 bytes to store. Therefore, the maximum size of a MCU is 10(data units)×8(width)×8(height)×2(bytes)=1280 Bytes, which is the minimum coefficient buffer size of the memory unit 112 for the progressive JPEG decoder to decode progressive JPEG images. Person skilled in the art should be noted that different data units in variety of image format specifications are suitable for the image-decoding system in the present invention.

Besides storing the coefficients, the memory unit 112 also needs to store Huffman/quantization tables. Up to 4 DC Huffman tables, 4 AC Huffman tables and 4 quantization tables are possibly seen in a JPEG file. Since each quantization table is 64 bytes and each pair of DC/AC Huffman table is less than 256 bytes, by the portion dividing multi-run mechanism, the memory unit 112 only needs 4×(64+256)= 1280 bytes to store all these tables. In other words, the required size of the memory unit 112 for progressive coefficients and Huffman/quantization table storage in the progressive JPEG decoder is only 2560 Bytes which is smaller than 1.2 Mbytes in the prior art when the image-decoding system decodes the same image file.

Figure 5:
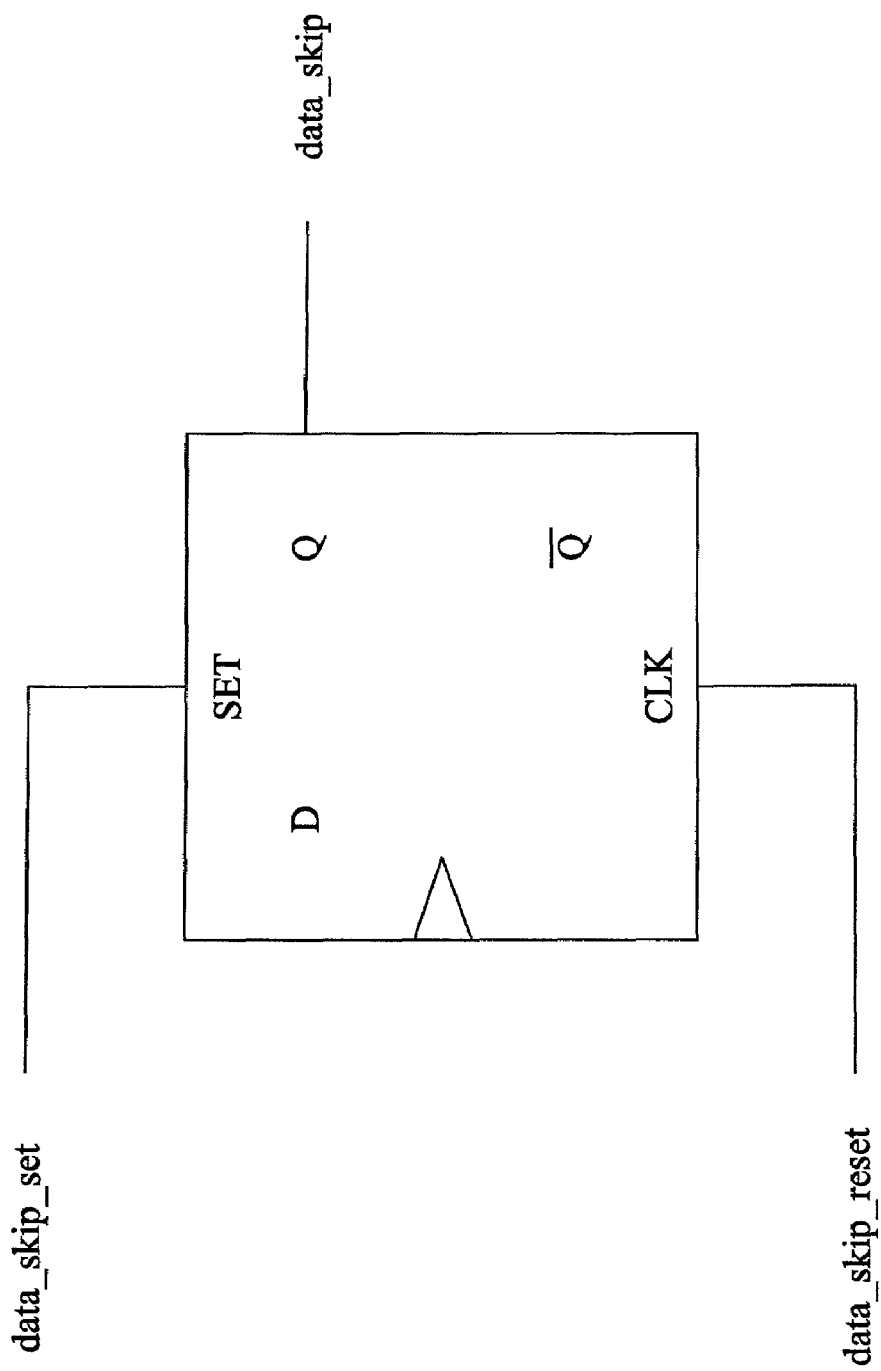
FIG. 5 is a diagram of a control unit in the multi-run mechanism of the image-decoding system according to the present invention.

FIG. 5 is a diagram of a control unit in the multi-run mechanism of the image-decoding system according to the present invention. Preferably, the control unit is flip-flop or the combination of logical gates or circuits. To process one portion of the image file and bypass the rest, the multi-run mechanism utilizes some indexes to identify the starting position and end position of the portion. In one embodiment, since the portion unit is MCU, the starting position and end position are measured in MCU numbers.

As a scan in an image file may contain all 3 components or only one of the three components, 4 sets of indexes, including intlv_first_mcu and intlv_last_mcu, comp0_first_data_unit and comp0_last_data_unit, comp1_first_mcu and comp1_last_mcu, and comp2_first_mcu and comp2_last_mcu, are defined.

Specifically, index intlv_first_mcu defines the first MCU number to process in an interleaved scan; index intlv_last_mcu defines the last MCU number to process in an interleaved scan; index comp0_first_data_unit defines the first data unit number to process in a non-interleaved scan containing component 0 only; index comp0_last_data_unit defines the last data unit number to process in a non-interleaved scan containing component 0 only; index comp1_first_mcu defines the first data unit number to process in a non-interleaved scan containing component 1 only; index comp1_last_mcu defines the last data unit number to process in a non-interleaved scan containing component 1 only; index comp2_first_mcu defines the first data unit number to process in a non-interleaved scan containing component 2 only; index comp2_last_mcu defines the last data unit number to process in a non-interleaved scan containing component 2 only.

Given the indexes, the hardware skips and do not process the data stream before the starting indexes (intlv_first_mcu, comp0_first_data_unit, comp1_first_data_unit, comp2_first_data_unit) and after the end indexes (intlv_last_ mcu, comp0_last_data_unit, comp1_last_data_unit, comp2_last_data_unit). A signal data_skip is generated for this purpose as in FIG. 5. When the data_skip stays high level, decoder skips the data processing of the current data and do not write back the decoded coefficients into the memory unit. When data_skip is low level, the decoder normally process data. Data_skip is configured by data_skip_set and data_skip_reset.

In one embodiment, the condition of data_skip_set and data_skip_reset to hold true is as follows: when the header parsing is done (SOS marker is over) and the starting index is not 0, data_skip_set goes high level to skip the first several MCUs until the index counter reaches the starting index; and also when the index counter reaches the end index and the current MCU is done, data_skip_set is active as well to skip the data in the remaining portions.

Similarly, data_skip_reset is active when the index counter equals to the starting index minus 1 and the current MCU ends, which means the MCU right before the first valid MCU is over. The data_skip_reset signal is inactive when the starting index is set to 0 because the default value of data_skip is 0 upon hardware reset. A starting index of 0 tells the decoder to process the data from the very first MCU in the image file.

The data_skip controlling scheme is good enough for DC first scan, DC refine scan and AC first scan since the Huffman decoding of any DC/AC coefficient in these 3 scans doesn't need the amplitude information from coefficients generated in previous scans. In one preferred embodiment of the present invention, the decoding of AC coefficients in AC refine scans provides the amplitude of AC coefficients generated in previous AC first scans. Due to limited memory usage in the prior art, some AC coefficients are skipped and the amplitude information is unavailable in memory unit. However, because the AC coefficient amplitude information from previous AC first scan is acquired, an AC refine scan in the present invention can decode the bit stream and therefore the MCU index counter can count correctly.

Figure 6:
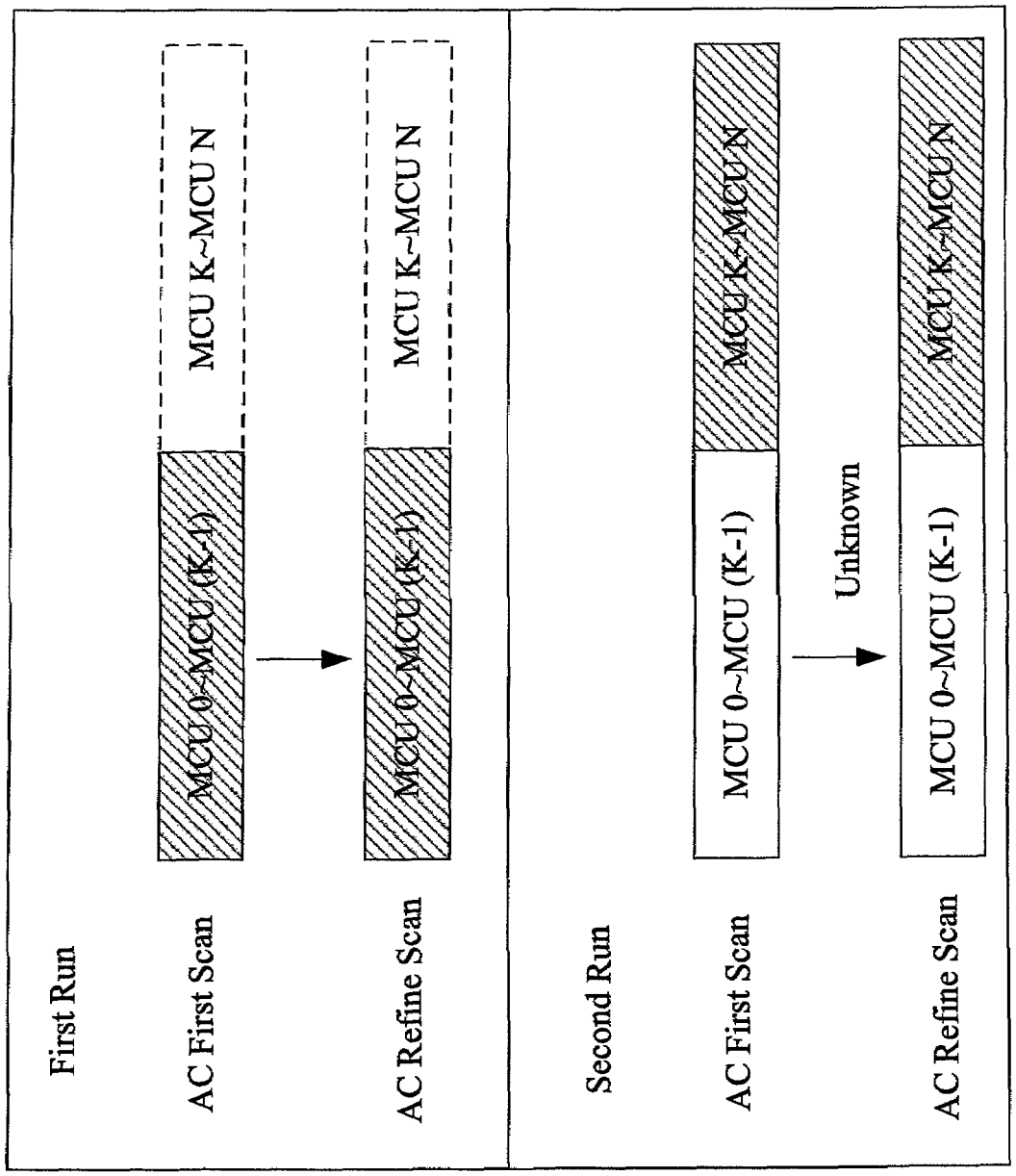
FIG. 6 is a diagram of a graphical interpretation of AC refine scan with the multi-run mechanism in FIG. 5 according to one embodiment of the present invention.

FIG. 6 is a diagram of a graphical interpretation of AC refine scan with the multi-run mechanism in FIG. 5 according to one embodiment of the present invention. For the first run, because the AC coefficients of MCU 0 to MCU (K−1) in AC first scan are stored in the memory unit, AC refine scan can use them to decode AC coefficients. Thus, AC refine scan can update the AC coefficients correctly. For the second run, the decoder do not know how many data bits are consumed by AC coefficients of MCU 0 to (K−1) in AC refine scan because no AC coefficients of MCU 0 to (K−1) in AC first scan are available. Therefore, the hardware of AC refine scan do not know where and when to start decoding MCU K.

Figure 7:
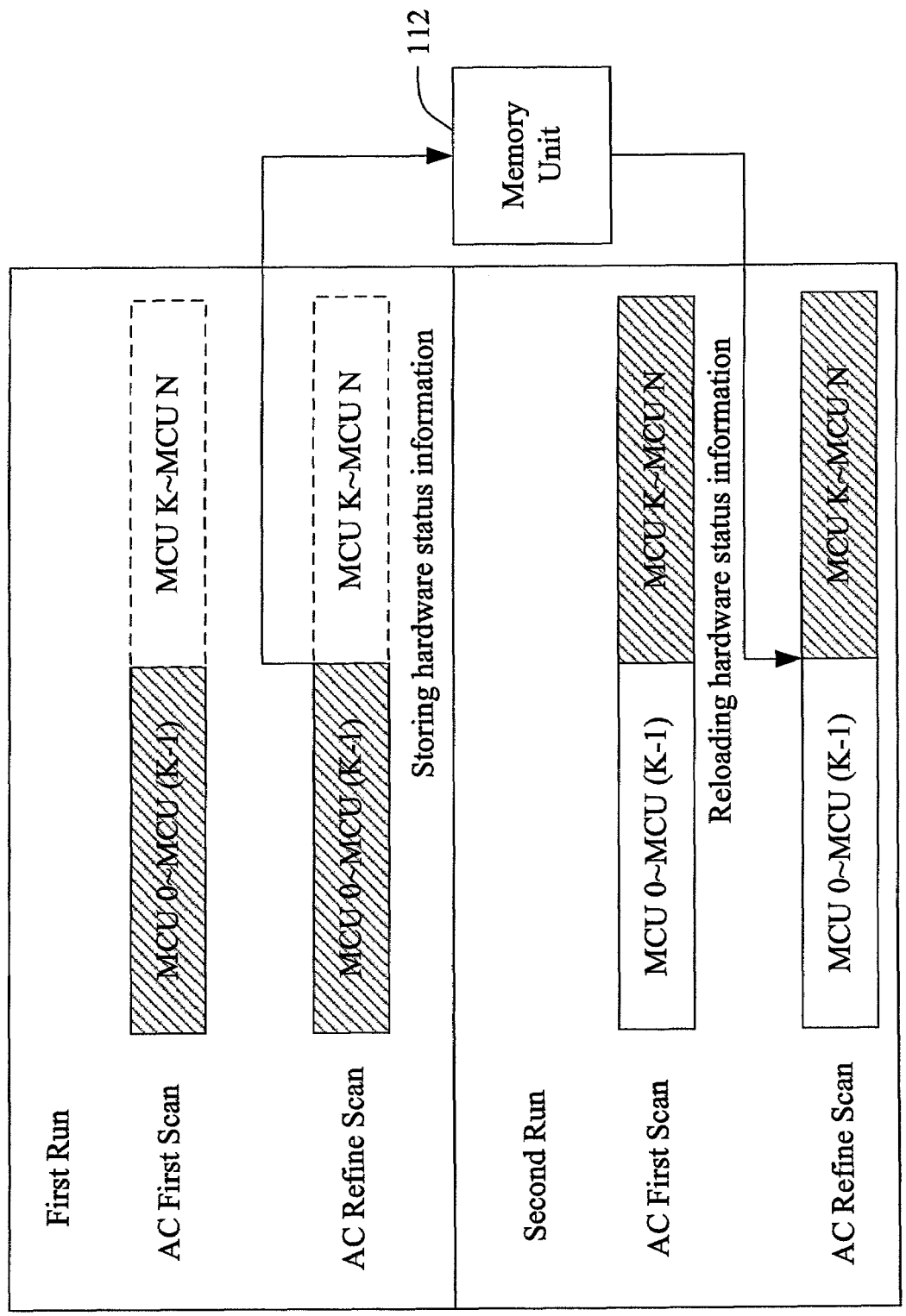
FIG. 7 is a solution to AC refine scan with the multi-run mechanism in FIG. 6 according to one embodiment of the present invention.

FIG. 7 is a solution to AC refine scan with the multi-run mechanism in FIG. 6 according to one embodiment of the present invention. In the present invention, the solution to this problem is to let AC refine scan proceed without AC coefficient amplitude information from previous scans (first scan). The solution can store hardware control signals and status information of MCU 0 to (K−1) into the memory unit 112 in FIG. 1 at the end of the AC refine scan in the previous run (first scan) and then reload these control signals and status information at the same AC refine scan in the current run (second scan). The hardware control signals and status information stored at the end of each AC refine scan include: (1) the location in the source image file where the current portion of AC refine scan ends; (2) EOB run length after the current portion of AC refine scan is done; and (3) values of the hardware control signals.

Figure 8:
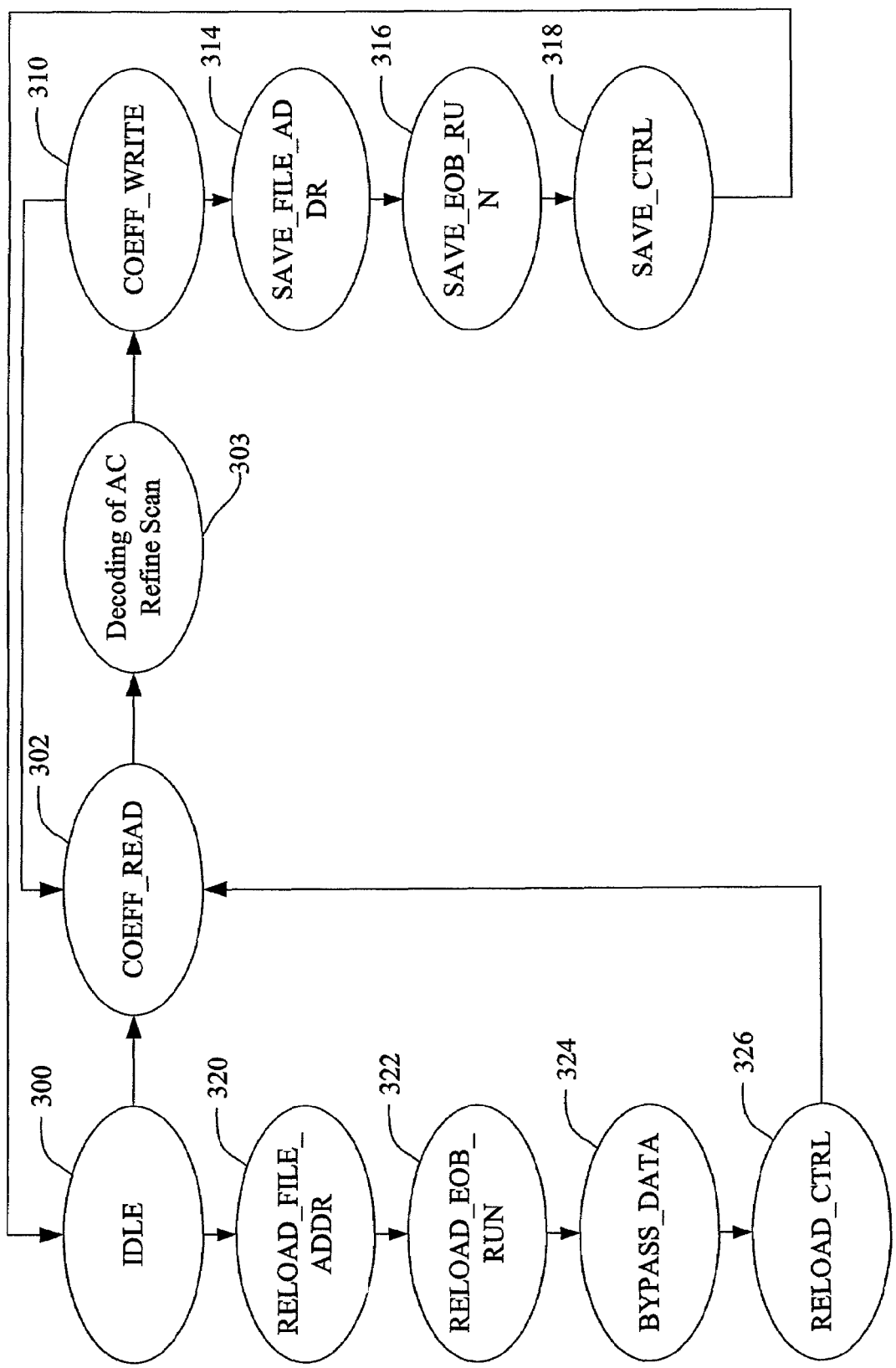
FIG. 8 is a state diagram of an AC refine scan with the multi-run mechanism in FIG. 7 according to one preferred embodiment of the present invention.

FIG. 8 is a state diagram of an AC refine scan with the multi-run mechanism in FIG. 7 according to one preferred embodiment of the present invention. Assume that the decoder is at the end of an AC refine scan, which is the second run, and the last coefficient located in the last MCU is to be written. Thus, the decoder is located in state COEFF_WRITE 310 and data_skip signal will rise soon. Before data_skip signal rises, some information has to be stored in memory unit for AC refine scans of the next run. Therefore, the state proceeds to state SAVE_FILE_ADDR 314 via state of "decoding of AC refine scan" 303. In state SAVE_FILE_ADDR, a copy of the current DMA address to access the source image file is stored into the memory unit. The state then proceeds to state SAVE_EOB_RUN 316 to save EOB run information in the memory unit. In state SAVE_CTRL 318, some control signal values are also stored into the memory unit. While the critical information copy is reserved in the memory unit, the state goes back to state IDLE 300 and prepares itself for the next scan or next run.

After saving information copy in the memory unit at the end of AC refine scans, the decoder performs an AC refine scan in the third run. Since this run is not the first run, it is necessary to obtain some information stored in the memory unit from previous run, i.e. the second run. Hence the state proceeds to state RELOAD_FILE_ADDR 320 to retrieve the DMA address to access source image file when the AC refine scan ends in the second run. The next state is RELOAD_EOB_RUN 322 to retrieve the EOB run information when the AC refine scan ends in previous run.

After obtaining DMA address of the image file and EOB run information, the hardware moves to state BYPASS_DATA 324 and bypass the data which is already processed by the previous run until the DMA counter meets the value of the DMA address restored in state RELOAD_FILE_ADDR 320. After bypassing the data processed by previous run, the state proceeds to state RELOAD_CTRL 326 which reloads several control signals. While the reload of control signals is done, the decoder is in the status exactly which is the same as the status when the same AC refine scan ends in the previous run. As a result, the decoder can continue the decoding process until the AC refine scan in the third run is over. When the third run in the AC refine scan is over, a copy of DMA address, EOB run information and control signals are definitely stored in the memory unit for the following run, e.g. fourth run.

In the present invention, the method of processing a plurality of data coefficients in a data stream composed of a plurality of portions, the method comprising the steps of: reading the data coefficients in each portion, respectively, by a decoding unit; figuring out a logical address of a codeword corresponding to the data coefficients; figuring out a physical address of the codeword corresponding to the data coefficients to allow the decoding unit to locate the codeword corresponding to the data coefficients based on the logical address and the physical address of the codeword; determining run length of the data coefficients to generate run length information according to the codeword during a first scan mode; computing the amplitude of the data coefficients based on the run length information during the first scan mode; writing the computed data coefficients into the memory unit according to the physical address to update the data coefficients in the memory unit during the first scan mode; and refining the updated data coefficients in the memory unit according to the run length information generated during the first scan mode if the decoding unit changes from the first scan mode to a second scan mode.

The advantages of the present invention include: (a) improve the speed performance in image decoder; (b) the image-decoding system saves memory of the image-decoding system to lift the memory usage limit; and (c) because the AC coefficient amplitude information from previous AC first scan is acquired, an AC refine scan in the present invention can decode the bit stream and therefore the MCU index counter can count correctly.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structures.

What is claimed is:

1. An image-decoding system for processing a plurality of data coefficients in a data stream composed of a plurality of portions, the image-decoding system comprising:
   a decoding unit, reading the data coefficients in each portion, respectively;
   an address generator coupled to the decoding unit, figuring out a logical address of a codeword corresponding to the data coefficients and figuring out a physical address of the codeword corresponding to the data coefficients to allow the decoding unit to locate the codeword corresponding to the data coefficients based on the logical address and the physical address of the codeword; and a memory unit coupled to the decoding unit and the address generator, storing the codeword and the data coefficients;

wherein the decoding unit determines run length of the data coefficients to generate run length information according to the codeword, computes the amplitude of the data coefficients based on the run length information, and writes the computed data coefficients into the memory unit according to the physical address to update the data coefficients in the memory unit during a first scan mode, and the decoding unit further refines the updated data coefficients according to the run length information generated during the first scan mode if the decoding unit changes from the first scan mode to a second scan mode in order to increase the speed performance of the image-decoding system.

2. The image-decoding system according to claim 1, wherein if the run length information is zero, the decoding unit decodes the current data coefficient to determine the value of the current data coefficient.

3. The image-decoding system according to claim 1, wherein if the run length information is a positive integer, the decoding unit programs the current data coefficient to zero during the first scan mode and the second scan.

4. The image-decoding system according to claim 1, wherein if the decoding unit decodes the even-indexed data coefficient and the run length information is a positive integer, the decoding unit continuously computes the amplitude of the next data coefficients.

5. The image-decoding system according to claim 1, wherein if the decoding unit decodes the odd-indexed data coefficient and the run length information is a positive integer, the decoding unit writes the even-indexed data coefficient and the odd-indexed data coefficient to the memory unit.

6. The image-decoding system according to claim 1, wherein if the decoding unit decodes the odd-indexed data coefficient and the run length information is zero, the decoding unit writes the even-indexed data coefficient and the odd-indexed data coefficient to the memory unit.

7. The image-decoding system according to claim 1, wherein if the decoding unit decodes the even-indexed data coefficient and the run length information is zero, the address generator figures out next logical address to generate next run length information to determine the value of the even-indexed data coefficient.

8. The image-decoding system according to claim 1, wherein during the first scan mode and the second scan, the decoding unit further stores the logical address and the physical address corresponding to the data coefficients into the memory unit, saves the run length information into the memory unit, and stores a plurality of control signals into the memory unit.

9. The image-decoding system according to claim 8, wherein the decoding unit further reloads either logical or physical address of the data coefficients from the memory unit, restores the run length information from the memory unit according to the either logical or physical address, and reloads the control signals of the data coefficients from the memory unit.

10. The image-decoding system according to claim 9, wherein if the decoding unit reloads either logical or physical address of the data coefficients and restores the run length information, the decoding unit further bypasses the data coefficients processed in the first scan mode.

11. The image-decoding system according to claim 1, wherein the run length is selected from a group consisting of an EOB run length representing the number of the portion having the zero data coefficients, a zero run length representing the number of zeros before a next non-zero data coefficient, and the combination.

12. A method of processing a plurality of data coefficients in a data stream composed of a plurality of portions, the method comprising the steps of:

reading the data coefficients in each portion, respectively, by a decoding unit;

figuring out a logical address of a codeword corresponding to the data coefficients;

figuring out a physical address of the codeword corresponding to the data coefficients to allow the decoding unit to locate the codeword corresponding to the data coefficients based on the logical address and the physical address of the codeword;

determining run length of the data coefficients to generate run length information according to the codeword during a first scan mode;

computing the amplitude of the data coefficients based on the run length information during the first scan mode;

writing the computed data coefficients into the memory unit according to the physical address to update the data coefficients in the memory unit during the first scan mode; and refining the updated data coefficients in the memory unit according to the run length information generated during the first scan mode if the decoding unit changes from the first scan mode to a second scan mode.

13. The method according to claim 12, wherein if the run length information is zero, the decoding unit decodes the current data coefficient to determine the value of the current data coefficient.

14. The method according to claim 12, wherein if the run length information is a positive integer, the decoding unit programs the current data coefficient to zero.

15. The method according to claim 12, wherein if the decoding unit decodes the even-indexed data coefficient and the run length information is a positive integer, the decoding unit continuously computes the amplitude of the data coefficients.

16. The method according to claim 12, wherein if the decoding unit decodes the odd-indexed data coefficient and the run length information is a positive integer, the decoding unit writes the even-indexed data coefficient and the odd-indexed data coefficient to the memory unit.

17. The method according to claim 12, wherein if the decoding unit decodes the odd-indexed data coefficient and the run length information is zero, the decoding unit writes the even-indexed data coefficient and the odd-indexed data coefficient to the memory unit.

18. The method according to claim 12, wherein if the decoding unit decodes the even-indexed data coefficient and the run length information is zero, the address generator figures out a next logical address to generate a next run length information to determine the value of the even-indexed data coefficient.

19. The method according to claim 12, before the step of refining the updated data coefficients during the second scan mode if the decoding unit changes from the first scan mode to the second scan mode, further comprising the steps of:

storing the logical address and the physical address corresponding to the data coefficients into the memory unit;

saving the run length information into the memory unit; and storing a plurality of control signals into the memory unit.

20. The method according to claim 19, further comprising the steps of:

reloading either logical or physical address of the data coefficients from the memory unit;

restoring the run length information from the memory unit according to the either logical or physical address; and reloading the control signals of the data coefficients from the memory unit.

21. The method according to claim 20, after reloading either logical or physical address of the data coefficients and restoring the run length information, further comprising a step of bypassing the data coefficients processed in the first scan mode.

22. The method according to claim 12, wherein the run length is selected from a group consisting of an EOB run length representing the number of the portion having the zero data coefficients, a zero run length representing the number of zeros before a next non-zero data coefficient, and the combination.

* * * * *